US011873119B1

(12) United States Patent
Duron et al.

(10) Patent No.: US 11,873,119 B1
(45) Date of Patent: Jan. 16, 2024

(54) FAST, SWAPPABLE MODULAR TRAY AND RACK STRUCTURE

(71) Applicant: U.S. Army Space and Missile Defense Command, Huntsville, AL (US)

(72) Inventors: Christopher M. Duron, New Market, AL (US); Gauge C. Day, Cullman, AL (US); Jessica L. Shrontz, Madison, AL (US); Travis S. Taylor, Somerville, AL (US)

(73) Assignee: The United States of America, as represented by the Secretary of the Army, Washington, DC (US)

(*) Notice: Subject to any disclaimer, the term of this patent is extended or adjusted under 35 U.S.C. 154(b) by 1217 days.

(21) Appl. No.: 16/514,242

(22) Filed: Jul. 17, 2019

Related U.S. Application Data

(60) Provisional application No. 62/714,393, filed on Aug. 3, 2018.

(51) Int. Cl.
  *H05K 7/14* (2006.01)
  *B64G 1/10* (2006.01)
  *B64G 1/22* (2006.01)

(52) U.S. Cl.
  CPC ............ *B64G 1/10* (2013.01); *H05K 7/1434* (2013.01); *H05K 7/1439* (2013.01); *B64G 1/223* (2023.08)

(58) Field of Classification Search
  CPC .......................... H05K 7/1434; H05K 7/1439
  USPC ....................................................... 361/731
  See application file for complete search history.

(56) References Cited

U.S. PATENT DOCUMENTS

| | | |
|---|---|---|
| 4,397,434 A | 8/1983 | Farnham |
| 5,136,468 A | 8/1992 | Wong et al. |
| 5,755,406 A | 5/1998 | Aston et al. |
| 5,896,273 A | 4/1999 | Varghese et al. |
| 6,201,702 B1 | 3/2001 | Schmitt |
| 7,513,462 B1 | 4/2009 | McKinnon et al. |
| 8,888,050 B1 | 11/2014 | Murphy et al. |
| 9,708,080 B2 | 7/2017 | Judd et al. |
| 9,760,382 B2 | 9/2017 | Judd et al. |
| 9,981,758 B2 | 5/2018 | Judd et al. |
| 10,059,468 B1 | 8/2018 | Judd et al. |
| 2006/0185277 A1 | 8/2006 | Quincieu |
| 2007/0029446 A1 | 2/2007 | Mosher et al. |
| 2007/0210681 A1* | 9/2007 | Adducci ................ H05K 7/183 312/328 |
| 2008/0217274 A1* | 9/2008 | Curnalia .............. H05K 7/1489 211/183 |

(Continued)

*Primary Examiner* — Hung S. Bui
(74) *Attorney, Agent, or Firm* — C. Joan Gilsdorf

(57) ABSTRACT

A modular satellite chassis includes frame rails having at least two front frame rails and two back frame rails. Transverse parallel ribs are disposed on the interiors of the front and back frame rails. The ribs on the front frame rails correspond in location to one another and to the ribs on the back frame rails. Each rib has a central longitudinal axis and a narrow first slot disposed along the central longitudinal axis. The ribs are spaced apart by wider second slots. Trays are slidingly received by the second slots on the front frame rails and the corresponding second slots on the back frame rails. A left side panel is connected to an outside of one of the front frame rails and one of the back frame rails. A right side panel is connected to an outside of the other front frame rail and the other back frame rail.

14 Claims, 5 Drawing Sheets

(56) References Cited

U.S. PATENT DOCUMENTS

| | | | |
|---|---|---|---|
| 2012/0019117 A1* | 1/2012 | Dunwoody | H05K 7/1491 |
| | | | 312/330.1 |
| 2012/0134106 A1* | 5/2012 | Xu | H05K 7/1492 |
| | | | 361/679.02 |
| 2014/0039729 A1 | 2/2014 | Puig-Suari et al. | |
| 2014/0263844 A1 | 9/2014 | Cook et al. | |
| 2016/0205814 A1 | 7/2016 | Burke | |
| 2016/0288931 A1 | 10/2016 | Field et al. | |
| 2016/0309605 A1* | 10/2016 | Cheng | H05K 7/1435 |
| 2016/0309611 A1* | 10/2016 | Yi | H04Q 1/062 |
| 2016/0340061 A1 | 11/2016 | Bose et al. | |
| 2018/0290768 A1 | 10/2018 | Faye et al. | |

* cited by examiner

US 11,873,119 B1

FAST, SWAPPABLE MODULAR TRAY AND RACK STRUCTURE

CROSS-REFERENCE TO RELATED APPLICATION

This application is related to and claims the benefit of priority to Provisional Application U.S. Ser. No. 62/714,393, titled "Fast, Swappable Modular Tray and Rack Structure," filed Aug. 3, 2018 in the U.S. Patent and Trademark Office, the contents of which are incorporated herein by reference.

STATEMENT OF GOVERNMENT INTEREST

The invention described herein may be manufactured, used, and licensed by or for the U.S. Government for governmental purposes without payment of any royalties thereon.

BACKGROUND

The present invention generally relates to space vehicles and, more particularly, to a chassis for satellites.

A typical conventional satellite rack or chassis does not provide convenient access to internal components. Many components are difficult to access and remove. Circuit boards are stacked together and typically bolted to the chassis. Assembly can be difficult and time consuming. To test or replace a circuit board, the entire satellite must often be disassembled. Although a specific component may be easily identified as malfunctioning, removal of the component can involve removing mounting hardware such as bolts or screws and disconnecting electrical connectors, and then replacing the mounting hardware and reconnecting the electrical connectors once the component has been replaced.

The use of hand tools such as screwdrivers to remove the mounting hardware increases the potential for damaging other components if the tools slip or are dropped when working in the limited space available. Further, a typical conventional chassis may require components and connectors to be aligned properly, resulting in damage if reconnection is forced.

Therefore, it is desirable to provide an improved satellite chassis architecture that facilitates convenient access to internal satellite components.

SUMMARY

The present invention solves or ameliorates the above-described problems and deficiencies by providing a fast, swappable modular tray and rack structure for a satellite chassis and, in particular, for a cubesat, that facilitates convenient access to the internal satellite components. The modular tray and rack structure provides a "plug and play" system that allows rapid installation and replacement or interchange of internal spacecraft hardware. Modular trays to which hardware components are mounted slide into slots of uniform dimensions and are entrapped by external panels. The trays may be interchanged, regardless of the hardware mounted thereon, and re-inserted into the same or a different slot. Thus, the invention can be used in a satellite to affix components in place without the use of fasteners for each component, enabling easy access and quick replacement or maintenance of individual components.

The use of outer panels to encase internal components reduces the total number of satellite fasteners needed and helps protect internal components from radiation. Also, the modular tray and rack structure simplifies manufacturing due to standardized slot dimensions. The modular tray and rack structure is scalable to all satellite sizes, provides a common chassis design, and enables customizable satellites.

In accordance with an embodiment of the invention, there is provided a space vehicle having a plurality of frame rails having a left front frame rail, a right front frame rail, a left back frame rail, and a right back frame rail. Each back frame rail is L-shaped with a first member and a second member. A plurality of transverse parallel ribs are disposed on the interiors of the front frame rails and the interiors of each first member of the back frame rails. The ribs on the front frame rails correspond in location to one another and to the ribs on the back frame rails. Each rib has a central longitudinal axis and a narrow first slot disposed along the central longitudinal axis. The ribs are spaced apart by wider second slots. A backplane is connected to the interiors of the second member of each back frame rail adjacent to each first member. The backplane is configured to route power and signals to a plurality of internal components. Each of a plurality of trays slides into the second slots on the front frame rails and the corresponding second slots on the back frame rails. A plurality of panels surround a periphery of the space vehicle and form a housing for the space vehicle to encase and hold the interior components in place.

In accordance with another embodiment of the invention, there is provided a modular satellite chassis having frame rails with at least two front frame rails and two back frame rails. Transverse parallel ribs are disposed on the interiors of the front and back frame rails. The ribs on the front frame rails correspond in location to one another and to the ribs on the back frame rails. Each rib has a central longitudinal axis and a narrow first slot disposed along the central longitudinal axis. The ribs are spaced apart by wider second slots. Trays are slidingly received by the second slots on the front frame rails and the corresponding second slots on the back frame rails. A left side panel is connected to an outside of one of the front frame rails and one of the back frame rails. A right side panel is connected to an outside of the other front frame rail and the other back frame rail.

In accordance with another embodiment of the invention, there is provided a modular tray and rack structure having a plurality of panels including at least a left side panel and a right side panel. A plurality of transverse parallel ribs are disposed on the interiors of the left and right side panels proximate to front and back edges of the left and right side panels. The ribs on the front edges correspond in location to one another and to the ribs on the back edges. At least one rib has a central longitudinal axis and a narrow first slot disposed along the central longitudinal axis. The ribs are spaced apart by wider second slots. A plurality of trays are slidingly received by the second slots on the front edges and the corresponding second slots on the back edges.

BRIEF DESCRIPTION OF THE DRAWINGS

Various aspects and advantages of the invention will become apparent from the following detailed description, taken in conjunction with the accompanying drawings. The drawings are not necessarily drawn to scale. In the drawings.

DETAILED DESCRIPTION

FIGS. 1 to 7 illustrate various aspects of a modular tray and rack structure for a cubesat satellite according to embodiments of the present invention. While the embodiments described below focus on cubesats, the invention, as set forth in the claims, is not so limited and may be scaled to satellites of any size.

Figure 1:
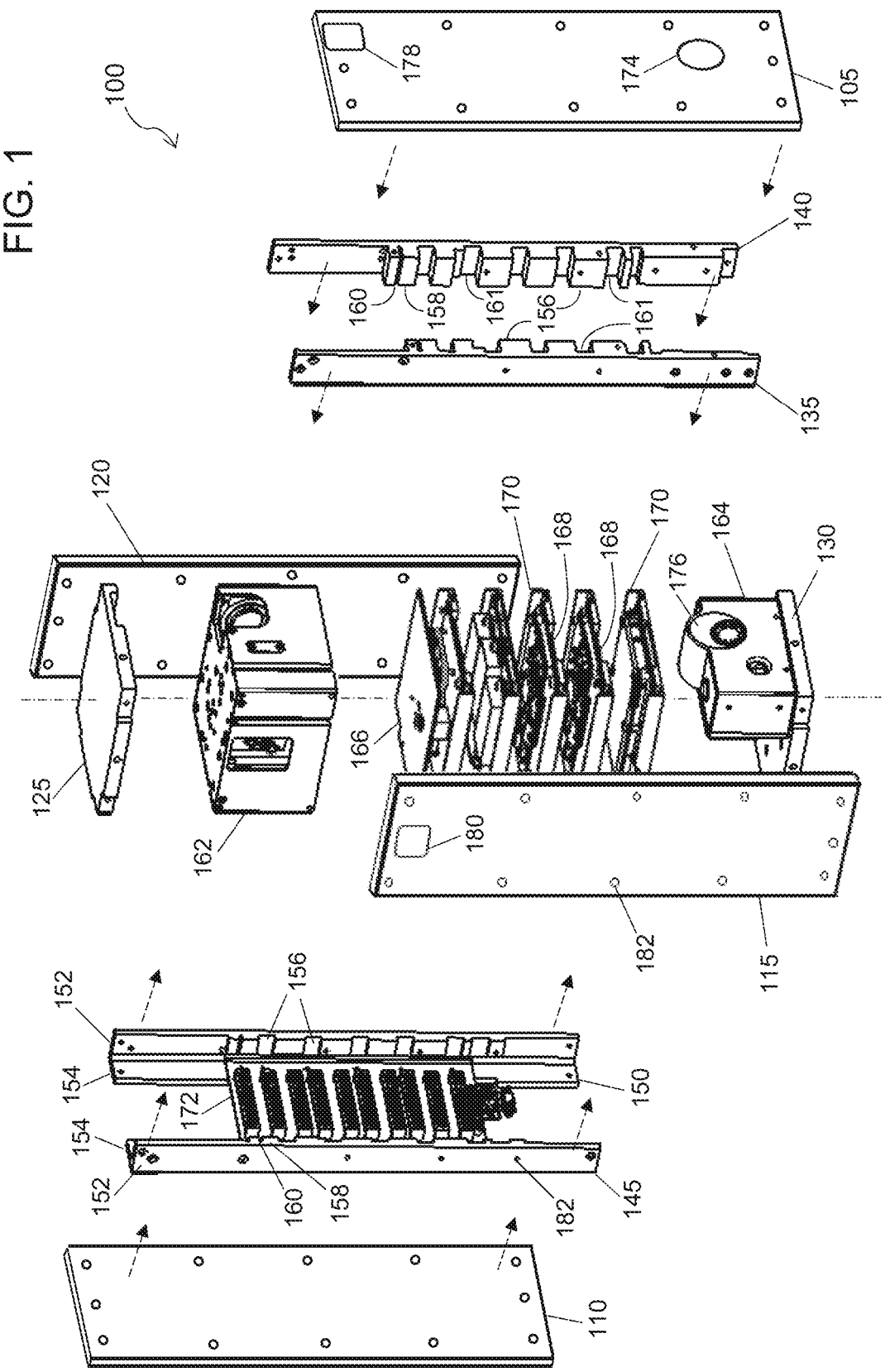
FIG. 1 is an exploded perspective view illustrating a modular tray and rack structure, including a backplane, circuit boards, and trays holding circuit boards, according to an embodiment of the present invention.

FIG. 1 illustrates an exploded view of a modular tray and rack structure 100. External features of the modular tray and rack structure 100 include a front panel 105, a back panel 110, a left side panel 115, a right side panel 120, a top panel 125, and a bottom panel 130. The front, back, left, and right panels 105, 110, 115, and 120 surround a left front frame rail 135, a right front frame rail 140, a left back frame rail 145, and a right back frame rail 150.

The back frame rails 145 and 150 are L-shaped and have a first member 152 and a second member 154. A series of transverse parallel ribs 156 are disposed on the interiors of the front frame rails 135 and 140 and on the interiors of the first members 152 of the back frame rails 145 and 150. The ribs 156 on the front frame rails 135 and 140 correspond in location to one another and to the ribs 156 on the back frame rails 145 and 150. At least one rib, such as rib 158, has a central longitudinal axis and a narrow first slot 160 disposed along the central longitudinal axis. The ribs 156, 158 are separated by wider second slots 161.

The modular tray and rack structure 100 houses various internal payloads and components including an attitude determination and control system (ADACS) 162, a camera 164, multiple circuit boards comprising first circuit boards 166 and second circuit boards 168 for performing various functions such as flight and power control, trays 170, a backplane 172 for routing power and signals to the internal components, among other components. The number of circuit boards, payloads, and other components may vary depending on the desired purpose. The front panel 105 has a structural cut-away 174 that is positioned in front of a lens 176 of the camera 164. Other structural cut-aways 178 and 180 on the front and left side panels 105, 115 are for navigation sensors on the ADACS 162. The shapes and configurations of the panels may vary depending on internal components selected and desired purposes and design choices.

The first circuit boards 166 may be custom boards that can be slotted without using one of the trays 170. The first circuit boards 166 are inserted directly into the smaller first slots 160 in the front frame rails 135, 140 and the corresponding first slots 160 in the back frame rails 145, 150 and slide into the modular tray and rack structure 100 until plugged into the backplane 172. The ribs 158 having the smaller first slots 160 provide support for the first circuit boards 166.

The second circuit boards 168 may be commercial circuit boards that are not designed to fit into the frame rails 135, 140, 145, and 150. The second circuit boards 168 are placed on the trays 170, which function as mechanical adapters for the second circuit boards 168. Electrical adapters (not shown) are first mounted onto the trays 170, and then the second circuit boards 168 are mounted onto the electrical adapters. The trays 170 slide into the larger second slot in the front frame rails 135, 140 and the corresponding second slots 161 in the back frame rails 145, 150 to allow connection of the second circuit boards 168 to the backplane 172. The ribs 156 bordering the larger second slots 161 provide support to the trays 170.

The backplane 172 attaches to interiors of the second member 154 of each back frame rail 145, 150 adjacent to each first member 152. The backplane 172 also attaches to the back panel 110. The front, back, left, and right panels 105, 110, 115, and 120 are secured to the frame rails 135, 140, 145, and 150. The top and bottom panels 125 and 130 are secured to the front, back, left, and right panels 105, 110, 115, and 120. The backplane 172 attaches to the back panel 110. The attachments may be accomplished through holes 182 using fasteners such as bolts.

Figure 3:
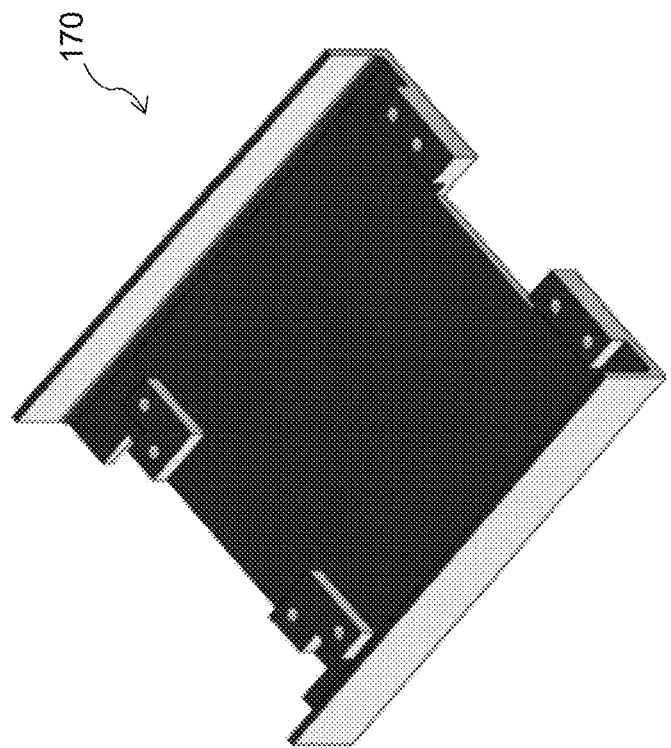
FIG. 3 is a perspective view illustrating one of the trays of FIGS. 1 and 2, according to an embodiment of the present invention.
Figure 2:
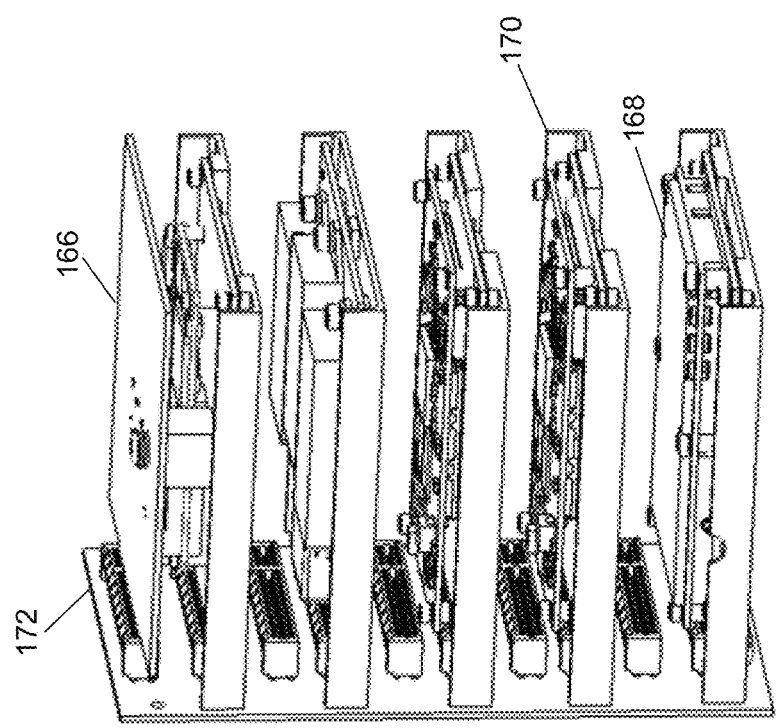
FIG. 2 is a perspective view illustrating the backplane, circuit boards, and trays holding circuit boards of FIG. 1, according to an embodiment of the present invention.

A close-up view of the circuit boards 166 and 168 and the trays 170 connected to the backplane 172 is shown in FIG. 2. A close-up view of one of the trays 170 is shown in FIG. 3. The slots 160 and 161 and the trays 170 eliminate the need for shelves, saving space and weight. The circuit boards 166 and 168 do not plug into one another, so no internal connectors or mechanical alignment devices such as guide pins are needed between the circuit boards 166 and 168. All the circuit boards 166 and 168, including those for the ADACS 162, power distribution, communications, payload, and others, all interconnect without electrical data/power connectors or cabling. Each circuit board 166 and 168 represents one subsystem rather than multiple subsystems. Thus, each circuit board 166 and 168 and its specific subsystem can be accessed independently of the other components. This modular design facilitates simplified assembly and disassembly; reliability; and maintenance, repair, and replacement of the components without disassembling the entire satellite.

Figure 5:
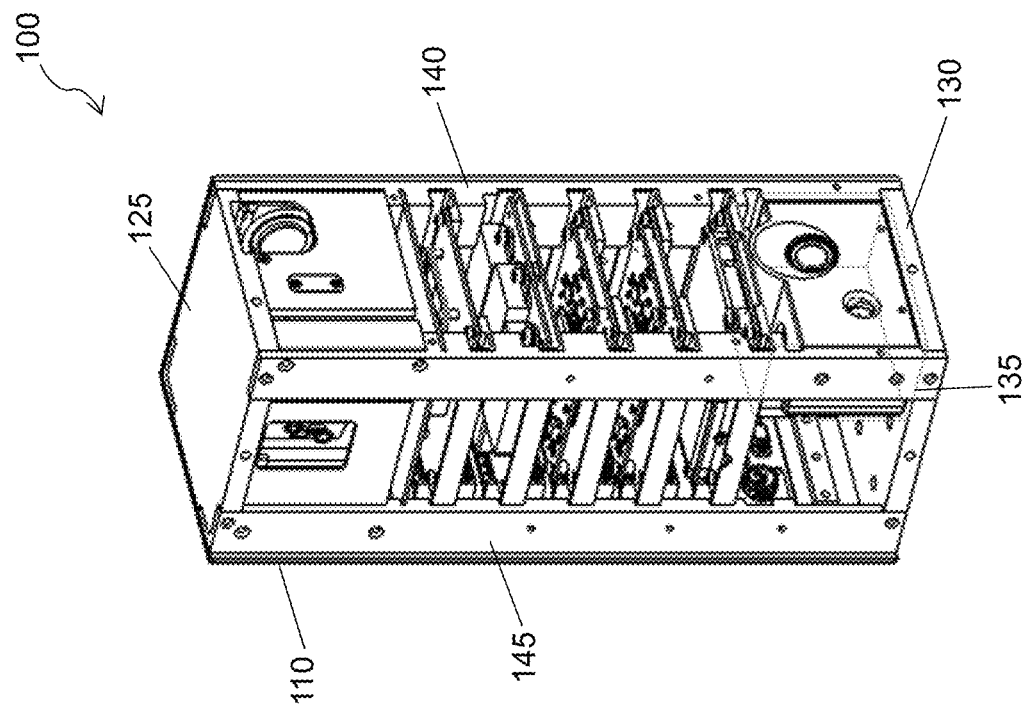
FIG. 5 is an assembled perspective view of the modular tray and rack structure of FIG. 1 without the front panel and a left side panel, according to an embodiment of the present invention.
Figure 4:
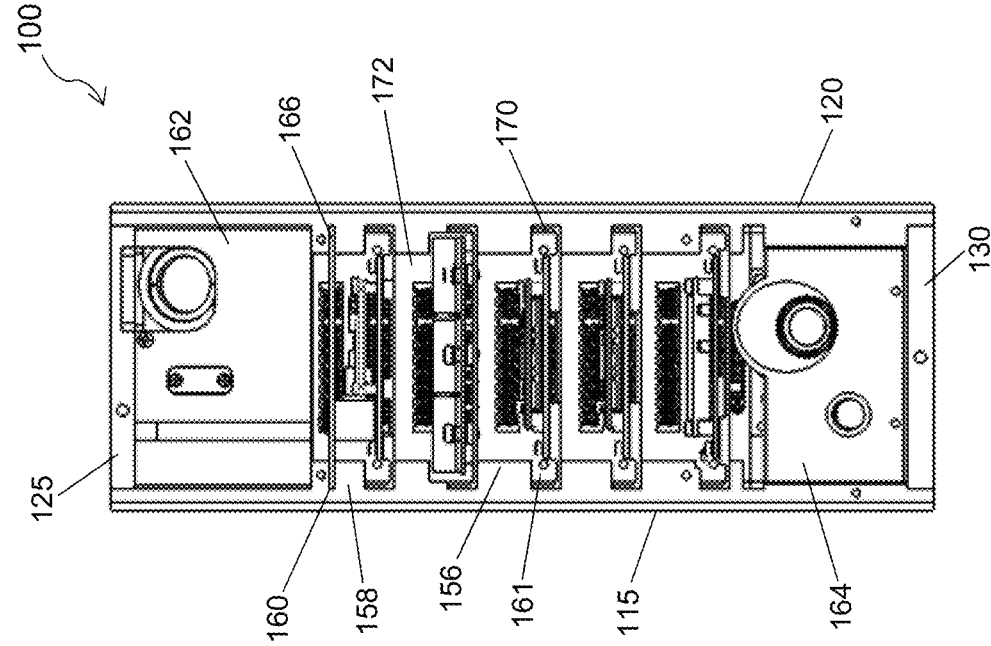
FIG. 4 is a front view of the assembled modular tray and rack structure of FIG. 1 without a front panel, according to an embodiment of the present invention.
Figure 6:
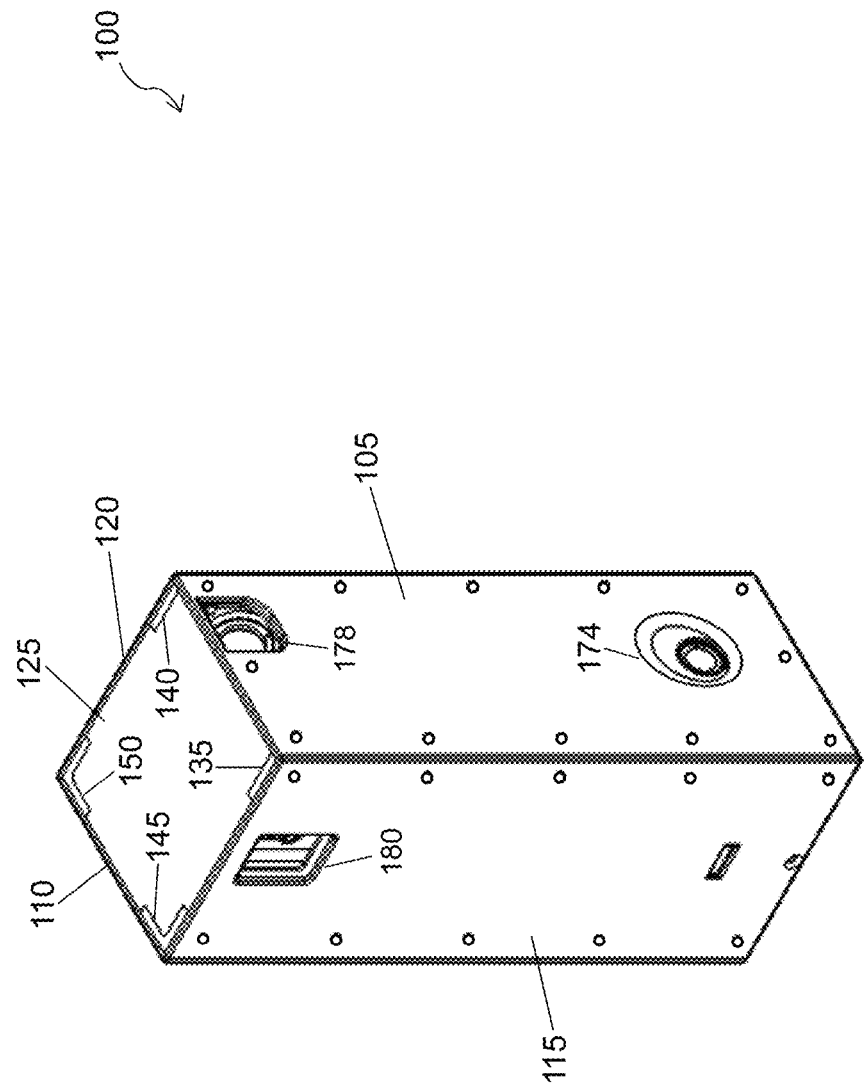
FIG. 6 is an assembled perspective view of the modular tray and rack structure of FIG. 1, according to an embodiment of the present invention.

A front view of the assembled modular tray and rack structure 100 without the front panel 105 is shown in FIG. 4, revealing components housed within. FIG. 5 illustrates the assembled modular tray and rack structure 100 without the front and left panels 105 and 115. FIG. 6 illustrates the assembled modular tray and rack structure 100 with all panels in place.

To assemble the modular tray and rack structure 100, the top and bottom panels 125 and 130 and the frame rails 135, 140, 145, and 150 are fastened together. Then the backplane 172 is fastened to the back frame rails 145, 150, and the back panel 110 is fastened to the top and bottom panels 125, 130 and to the back frame rails 145, 150. Next, the side panels 115, 120 are fastened to the top and bottom panels 125, 130 and to the frame rails 135, 140, 145, 150. The trays 170 and the circuit boards 166 and 168 are slid into the slots 160 and 161 and connected to the backplane 172, then the front panel 105 is fastened to the top and bottom panels 125 and 130 and to the front frame rails 135 and 140. The panels 105, 110, 115, 120, 125, and 130 form walls and a housing for the modular tray and rack structure 100, encasing and holding the slotted components in place.

Figure 7:
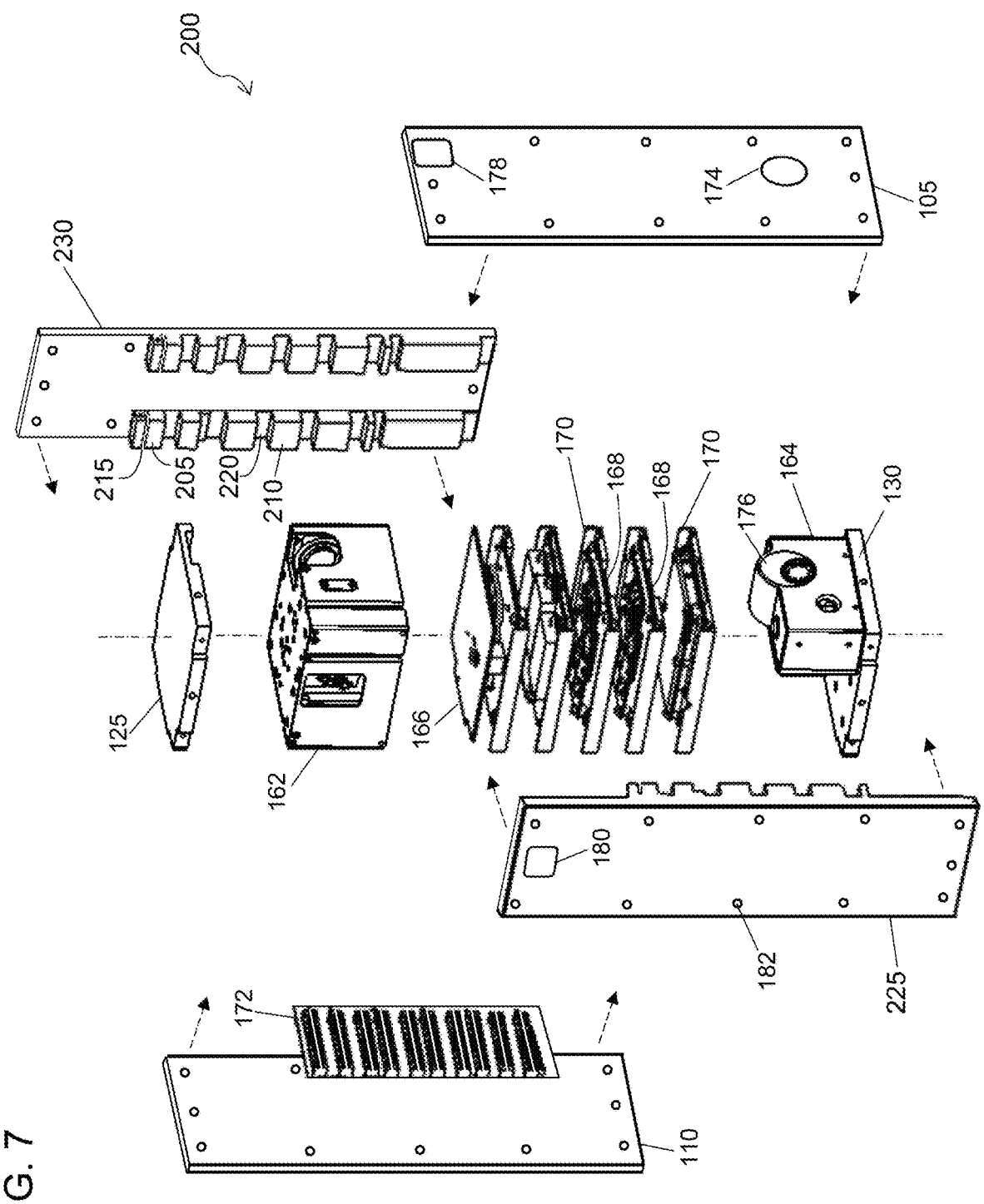
FIG. 7 is an exploded perspective view illustrating a modular tray and rack structure, according to another embodiment of the present invention.

In an alternative embodiment, as shown in the exploded view of FIG. 7, a modular tray and rack structure 200 incorporates ribs 205, 210 and slots 215, 220 into left and right side panels 225, 230, and the front and back frame rails 135, 140, 145, 150 are not used. Other embodiments are possible. For example, all panels except the front panel may be integrally manufactured with a removable front panel. Assembly is the same as above, except the backplane 172 is attached directly to the back panel 110 and the front and back frame rails 135, 140, 145, 150 are not used.

There are several advantages to the modular tray and rack structure 100, including the following:

(a) The modular "plug-in" design of the modular tray and rack structure reduces the time and effort required to access, test, remove, replace, and maintain each individual circuit board without disassembling the entire satellite.

(b) The standardized tray and rack slot dimensions facilitate a common chassis design and simplify manufacturing, while allowing the trays to be customized for desired hardware.

(c) The outer panels that encase the internal components reduce the number of fasteners and provide radiation shielding for internal components and thermal control surfaces.

(d) The modular tray and rack structure is scalable to all satellite sizes, and is not limited to nano-class satellites.

(e) The modular tray and rack structure, according to the embodiments described herein, has demonstrated NASA spaceflight vibration qualification, and has successfully been launched and integrated onto the International Space Station.

While the foregoing written description of the invention enables one of ordinary skill to make and use what is described herein, those of ordinary skill will understand and appreciate the existence of variations, combinations, and equivalents of the disclosed embodiments and methods. The invention should therefore not be limited by the above description, but by all embodiments and methods within the scope and spirit of the invention as disclosed.

What is claimed is:

1. A modular satellite chassis, comprising:
   a plurality of frame rails comprising a left front frame rail, a right front frame rail, a left back frame rail, and a right back frame rail, each back frame rail being substantially L-shaped with a first member and a second member;
   a plurality of transverse parallel ribs disposed on the interiors of the front frame rails and the interiors of each first member of the back frame rails, the ribs on the front frame rails corresponding in location to one another and to the ribs on the back frame rails, each rib having a central longitudinal axis and a narrow first slot disposed along the central longitudinal axis, and the ribs being spaced apart by wider second slots;
   a backplane connected to interiors of the second member of each back frame rail and adjacent to each first member;
   a plurality of trays slidingly received by the second slots on the front frame rails and the corresponding second slots on the back frame rails;
   a plurality of internal components comprising a plurality of first and second circuit boards, the first circuit boards being directly slidably received by the first slots of the front frame rails and the corresponding first slots of the back frame rails, and the second circuit boards being attached to the trays and the trays being slidably received by the second slots of the front frame rails and the corresponding second slots of the back frame rails, the first and second circuit boards electrically plugging into the backplane and the backplane routing power and signals to the internal components; and
   a plurality of panels surrounding a periphery of the modular satellite chassis and forming a housing for the modular satellite chassis to encase and hold the internal components in place.

2. The modular satellite chassis of claim 1, wherein any of the first and second circuit boards can be accessed, removed, and replaced independently of the other first and second circuit boards, and independently of any other of the internal components by removing the front panel.

3. The modular satellite chassis of claim 1, wherein any of the first and second circuit boards can be accessed for testing independently of the other first and second circuit boards, and independently of any other of the internal components by removing any of the front, left, and right panels.

4. The modular satellite chassis of claim 1, wherein the plurality of panels comprises front, back, left, right, top, and bottom panels, the plurality of panels joined together to form a rectangular box shape.

5. The modular satellite chassis of claim 1, wherein the satellite is a cubesat.

6. The modular satellite chassis of claim 1, wherein the plurality of panels is connected to the plurality of frame rails using bolts.

7. The modular satellite chassis of claim 1, wherein the plurality of panels provides radiation shielding and thermal control for the internal components.

8. A modular satellite chassis, comprising:
   a plurality of frame rails including at least two front frame rails and two back frame rails, each back frame rail being L-shaped with a first member and a second member;
   a plurality of transverse parallel ribs disposed on the interiors of the front and back frame rails, the ribs on the front frame rails corresponding in location to one another and to the ribs on the back frame rails, each rib having a central longitudinal axis and a narrow first slot disposed along the central longitudinal axis, and the ribs being spaced apart by wider second slots;
   a backplane connected to interiors of the second member of each back frame rail and adjacent to each first member;
   a plurality of trays slidingly received by the second slots on the front frame rails and the corresponding second slots on the back frame rails;
   a plurality of internal components comprising a plurality of first and second circuit boards, the first circuit boards being directly slidably received by the first slots of the front frame rails and the corresponding first slots of the back frame rails, and the second circuit boards being attached to the trays and the trays being slidably received by the second slots of the front frame rails and the corresponding second slots of the back frame rails, the first and second circuit boards electrically plugging into the backplane and the backplane routing power and signals to the internal components; and
   a plurality of panels including at least a left side panel and a right side panel, the left side panel connected to an outside of one of the front frame rails and one of the back frame rails and the right side panel connected to an outside of the other front frame rail and the other back frame rail.

9. The modular satellite chassis of claim 8, wherein any of the first and second circuit boards can be accessed independently of the other first and second circuit boards, and independently of any other of the internal components by removing the front panel.

10. The modular satellite chassis of claim 8, wherein the plurality of panels further comprises front, back, top, and bottom panels, the top panel connected to a top of the left and right side panels, the bottom panel connected to a bottom of the left and right side panels, the back panel connected to an outside of each of the second members of the back frame rails and to a back edge of the top panel and a back edge of the bottom panel, and the front panel connected to a front edge of the top panel and to a front edge of the bottom panel, the plurality of panels forming walls for the chassis to encase and hold the internal components in place.

11. The modular satellite chassis of claim 10, wherein the plurality of panels provides radiation shielding and thermal control for the internal components.

12. A modular tray and rack structure, comprising:
   a plurality of panels including at least a left side panel, a right side panel, and a back panel;
   a plurality of transverse parallel ribs disposed on the interiors of the left and right side panels proximate to front and back edges of the left and right side panels, the ribs on the front edges corresponding in location to one another and to the ribs on the back edges, at least one rib having a central longitudinal axis and a narrow first slot disposed along the central longitudinal axis, and the ribs being spaced apart by wider second slots;
   a plurality of trays slidingly received by the second slots on the front edges and the corresponding second slots on the back edges;
   a backplane attached to an interior of the back panel and the back panel attached to the left and right side panels; and
   a plurality of internal components comprising a plurality of first and second circuit boards, the first circuit boards being directly slidably received by the first slots of the front edges and the corresponding first slots of the back edges, and the second circuit boards being placed on the trays and the trays being slidably received by the second slots of the front edges and the corresponding second slots of the back edges, the first and second circuit boards electrically plugging into the backplane and the backplane routing power and signals to the internal components.

13. The modular satellite chassis of claim 12, wherein any of the first and second circuit boards can be accessed independently of the other first and second circuit boards, and independently of any other of the internal components by removing the front panel.

14. The modular satellite chassis of claim 12, wherein the plurality of panels further comprises front, top, and bottom panels, the top panel connected to a top of the left and right side panels, the bottom panel connected to a bottom of the left and right side panels, the back panel connected to a back edge of the top panel and a back edge of the bottom panel, and the front panel connected to a front edge of the top panel and to a front edge of the bottom panel, the plurality of panels forming walls for the chassis to encase and hold the internal components in place.

* * * * *